_(12)_ United States Patent
De Jong et al.

(10) Patent No.: US 8,514,365 B2
(45) Date of Patent: Aug. 20, 2013

(54) LITHOGRAPHIC APPARATUS AND DEVICE MANUFACTURING METHOD

(75) Inventors: Frederik Eduard De Jong, Eindhoven (NL); Marcel Hendrikus Maria Beems, Veldhoven (NL); Marinus Aart Van Den Brink, Moergestel (NL); Johannes Henricus Wilhelmus Jacobs, Eindhoven (NL); Martinus Hendrikus Antonius Leenders, Rhoon (NL); Leon Martin Levasier, Hedel (NL); Frits Van Der Meulen, Eindhoven (NL); Joost Jeroen Ottens, Veldhoven (NL); Koen Jacobus Johannes Maria Zaal, Eindhoven (NL); Richard Bernardus Johannes Droste, Weebosch-Bergeijk (NL); Johannes Wilhelmus De Klerk, Knegsel (NL); Peter Franciscus Wanten, Mierlo (NL); Jan Cornelis Van Der Hoeven, Veldhoven (NL); Edwin Cornelis Kadijk, Eindhoven (NL); Marteijn De Jong, Wintelre (NL); David Lucien Anstotz, Westhoffen (FR)

(73) Assignee: ASML Netherlands B.V., Veldhoven (NL)

( * ) Notice: Subject to any disclaimer, the term of this patent is extended or adjusted under 35 U.S.C. 154(b) by 1038 days.

(21) Appl. No.: 11/806,662

(22) Filed: Jun. 1, 2007

(65) Prior Publication Data

US 2008/0297744 A1    Dec. 4, 2008

(51) Int. Cl.
*G03B 27/52* (2006.01)
*G03B 27/68* (2006.01)
*G03B 27/58* (2006.01)
*G03B 27/60* (2006.01)
*G03B 27/32* (2006.01)

(52) U.S. Cl.
USPC ............... 355/30; 355/52; 355/55; 355/72; 355/73; 355/77

(58) Field of Classification Search
USPC ............ 355/30, 50, 53, 55, 77, 52, 67–71, 355/72–73; 359/665–667; 250/492.1, 492.2, 250/492.22, 548; 430/8, 311
See application file for complete search history.

(56) References Cited

U.S. PATENT DOCUMENTS

| 4,509,852 | A | 4/1985 | Tabarelli et al. ............... 355/30 |
| 7,193,232 | B2 | 3/2007 | Lof et al. ....................... 250/548 |

(Continued)

FOREIGN PATENT DOCUMENTS

| EP | 1 420 300 A2 | 5/2004 |
| EP | 1 429 188 | 6/2004 |

(Continued)

OTHER PUBLICATIONS

English translation of WO2004/112108, published Dec. 23, 2004.*

(Continued)

*Primary Examiner* — Toan Ton
*Assistant Examiner* — Christina Riddle
(74) *Attorney, Agent, or Firm* — Pillsbury Winthrop Shaw Pittman LLP (57) ABSTRACT

An immersion lithographic apparatus is described with a drain configured to remove liquid from a gap between an edge of the substrate and the substrate table on which the substrate is supported. The drain is provided with a means to provide liquid to the drain irrespective of the position of the substrate table and/or a means to saturate gas within the drain. Those measures reduce the variations in heat load due to evaporation of liquid in the drain.

20 Claims, 3 Drawing Sheets

(56) References Cited

U.S. PATENT DOCUMENTS

| | | | |
|---|---|---|---|
| 7,420,194 B2* | 9/2008 | Ottens et al. | 250/548 |
| 7,662,746 B2 | 2/2010 | Yaghi et al. | |
| 2004/0160582 A1* | 8/2004 | Lof et al. | 355/30 |
| 2004/0207824 A1 | 10/2004 | Lof et al. | 355/30 |
| 2005/0122505 A1* | 6/2005 | Miyajima | 355/72 |
| 2005/0219488 A1* | 10/2005 | Nei et al. | 355/53 |
| 2005/0231694 A1* | 10/2005 | Kolesnychenko et al. | 355/53 |
| 2005/0264778 A1* | 12/2005 | Lof et al. | 355/53 |
| 2005/0282405 A1* | 12/2005 | Harpham et al. | 438/795 |
| 2006/0001851 A1* | 1/2006 | Grant et al. | 355/53 |
| 2006/0012765 A1* | 1/2006 | Kameyama | 355/53 |
| 2006/0038968 A1* | 2/2006 | Kemper et al. | 355/18 |
| 2006/0077367 A1* | 4/2006 | Kobayashi et al. | 355/53 |
| 2006/0119809 A1* | 6/2006 | Verhagen et al. | 355/30 |
| 2006/0119816 A1* | 6/2006 | Baselmans et al. | 355/53 |
| 2006/0139614 A1* | 6/2006 | Owa et al. | 355/72 |
| 2006/0250590 A1* | 11/2006 | Streefkerk et al. | 355/53 |
| 2006/0285091 A1* | 12/2006 | Parekh et al. | 355/30 |
| 2006/0285096 A1* | 12/2006 | Jacobs et al. | 355/53 |
| 2006/0290908 A1* | 12/2006 | De Graaf et al. | 355/53 |
| 2007/0053701 A1 | 3/2007 | Nagata et al. | 399/24 |
| 2007/0146665 A1* | 6/2007 | Ottens et al. | 355/53 |
| 2007/0177124 A1* | 8/2007 | Shneyder et al. | 355/72 |
| 2007/0229786 A1 | 10/2007 | Kemper et al. | |
| 2007/0229787 A1* | 10/2007 | Emoto | 355/53 |
| 2007/0269294 A1* | 11/2007 | Nagasaka et al. | 414/217.1 |
| 2008/0106715 A1* | 5/2008 | Lin et al. | 355/53 |
| 2008/0111984 A1 | 5/2008 | Shibuta | |

FOREIGN PATENT DOCUMENTS

| | | |
|---|---|---|
| EP | 1 420 300 A3 | 8/2005 |
| JP | 10-012515 | 1/1998 |
| JP | 2004-040067 | 2/2004 |
| JP | 2007-005795 | 1/2007 |
| JP | 2007-072118 | 3/2007 |
| JP | 2007-266603 | 10/2010 |
| WO | WO 99/49504 | 9/1999 |
| WO | WO 2004112108 A1 * | 12/2004 |
| WO | 2006/064851 | 6/2006 |

OTHER PUBLICATIONS

Nicolaas Rudolf Kemper, U.S. Appl. No. 11/390,427, filed Mar. 28, 2006.

Japanese Office Action mailed Jan. 5, 2011 in Japanese patent application No. 2008-309635.

* cited by examiner

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

Figure 2:
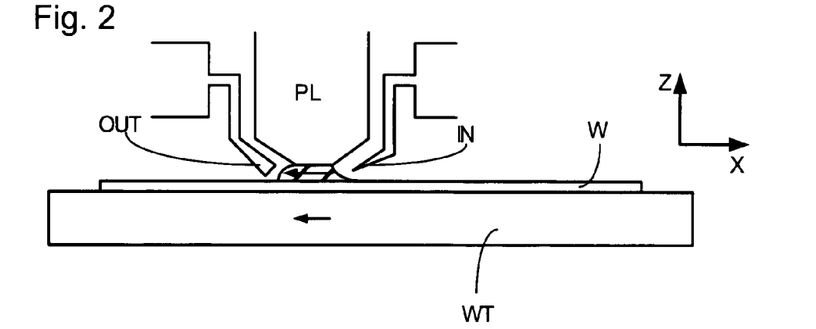
FIGS. 2 and 3 depict a liquid supply system for use in a lithographic projection apparatus.
Figure 3:
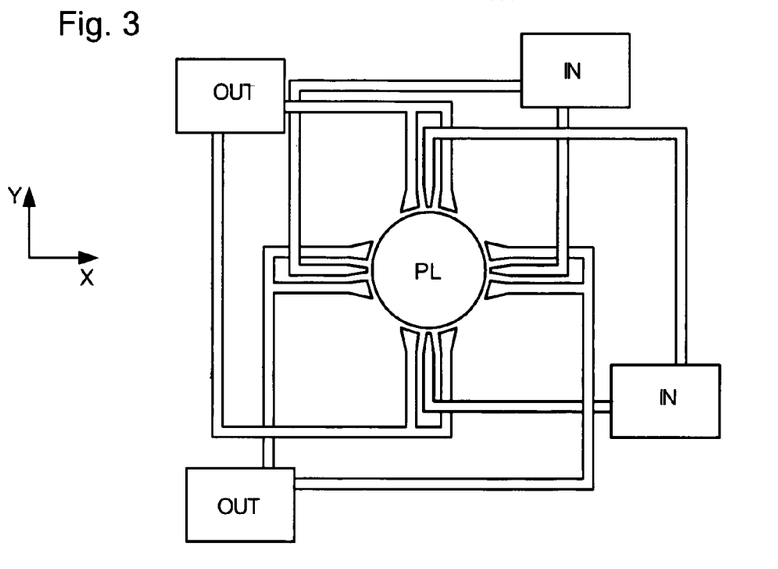

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent publication WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Figure 4:
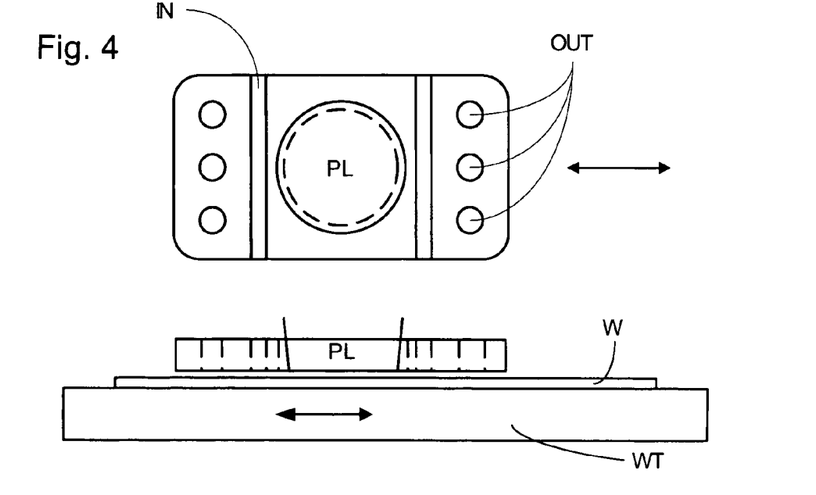
FIG. 4 depicts another liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European patent application publication no. EP 1420300 and United States patent application publication no. US 2004-0136494 (now granted as U.S. Pat. No. 7,193,232), the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Handling immersion liquid in a lithographic apparatus brings with it one or more problems of liquid handling. A gap normally exists between an object, such as a substrate and/or a sensor, and a substrate table around the edge of the object (e.g., substrate). U.S. patent application publication US 2005-0264778, discloses filling that gap with material or providing a liquid source or low pressure source to deliberately fill the gap with liquid in order to avoid bubble inclusion as the gap passes under the liquid supply system and/or to remove any liquid which does enter the gap.

SUMMARY

It is desirable, for example, to provide for removal of liquid from a gap between an edge of an object and a substrate table on which the object is positioned. The object may be a substrate, a sensor, a closing plate, etc.

According to an aspect of the invention, there is provided a lithographic apparatus, comprising:

a substrate table constructed to hold a substrate;

a drain in the substrate table configured to receive a first liquid which leaks, in use, between an edge of an object on the substrate table and the substrate table;

an outlet to the drain for the flow of liquid and/or gas out of the drain; and a liquid supply device configured to actively supply a second liquid to the drain independent of the position of the substrate table.

According to an aspect of the invention, there is provided a lithographic apparatus comprising:

a substrate table constructed to hold a substrate;

a liquid supply system configured to provide a liquid on a localized area of the substrate, the substrate table and/or an object on the substrate table between the substrate, substrate table and/or object and a projection system;

a drain in the substrate table configured to contain liquid which leaks, in use, between an edge of the substrate and/or object and the substrate table;

an outlet connected to an underpressure source and to the drain and arranged to remove liquid and/or gas from the drain; and a saturator configured to saturate any gas which enters and/or leaves the drain with liquid.

According to an aspect of the invention, there is provided a device manufacturing method comprising projecting a patterned beam of radiation through a liquid onto a substrate and collecting liquid which leaks between an edge of an object and a substrate table configured to hold the substrate in a drain, removing liquid from the drain and saturating gas flowing in and/or out of the drain.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
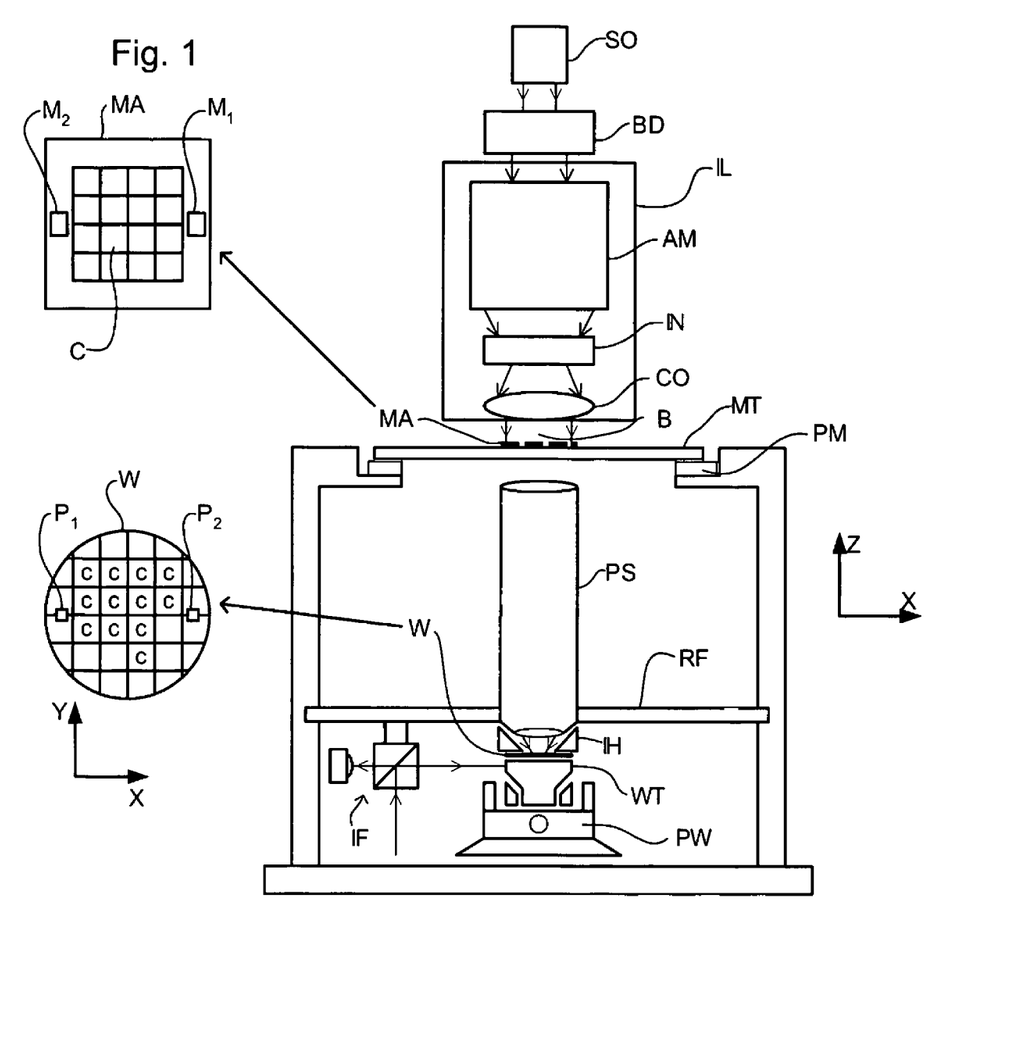
FIG. 1 depicts a lithographic apparatus according to an embodiment of the invention.

FIG. 1 schematically depicts a lithographic apparatus according to one embodiment of the invention. The apparatus comprises:

an illumination system (illuminator) L configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 5:
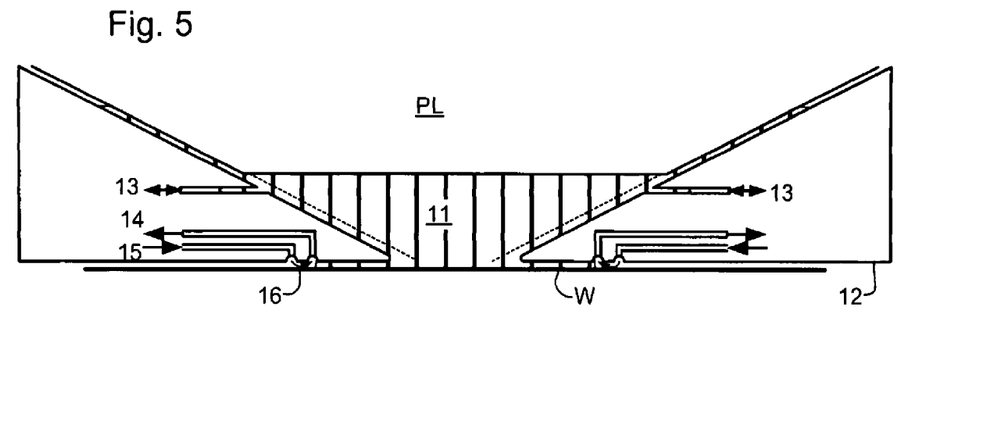
FIG. 5 depicts a localized area liquid supply system.

Although one or more embodiments of the present invention can be used with any type of liquid supply system, the design discussed herein is optimized for use with a localized area liquid supply system such as that illustrated in FIG. 5. In this type of liquid supply system, liquid is only provided to a small area of the total top surface of a substrate at any one time. It is illustrative briefly to describe the operation of a localized area liquid supply system.

Referring to FIG. 5, the localized area liquid supply system comprises a liquid supply system with a liquid confinement structure which extends along at least a part of a boundary of the space between the final element of the projection system and the substrate table. The liquid confinement structure is substantially stationary relative to the projection system in the XY plane though there may be some relative movement in the Z direction (in the direction of the optical axis). In an embodiment, a seal is formed between the liquid confinement structure and the surface of the substrate and may be a contactless seal such as a gas seal.

The liquid confinement structure 12 at least partly contains immersion liquid in the space 11 between a final element of the projection system PL and the substrate W. A contactless seal 16 to the substrate may be formed around the image field of the projection system so that liquid is confined within the space between the substrate surface and the final element of the projection system. The space is at least partly formed by the liquid confinement structure 12 positioned below and surrounding the final element of the projection system PL. Liquid is brought into the space below the projection system and within the liquid confinement structure 12 by liquid inlet 13 and may be removed by liquid outlet 13. The liquid confinement structure 12 may extend a little above the final element of the projection system and the liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is contained in the space 11 by a gas seal 16 which, during use, is formed between the bottom of the liquid confinement structure 12 and the surface of the substrate W. The gas seal is formed by gas, e.g. air or synthetic air but, in an embodiment, $N_2$ or another inert gas, provided under pressure via inlet 15 to the gap between liquid confinement structure 12 and substrate and extracted via outlet 14. The overpressure on the gas inlet 15, vacuum level on the outlet 14 and geometry of the gap are arranged so that there is a high-velocity gas flow inwards that confines the liquid. Those inlets/outlets may be annular grooves which surround the space 11 and the flow of gas 16 is effective to contain the liquid in the space 11. Such a system is disclosed in United States patent application publication no. US 2004-0207824.

Other solutions are possible and one or more embodiments of the present invention are equally applicable to those. For example, in place of the gas seal 16 it is possible to have a single phase extractor which only extracts liquid. Radially outwardly of such a single phase extractor could be one or more features to produce a gas flow to help contain the liquid in the space. One such type of feature might be a so-called gas knife in which a thin jet of gas is directed downwards onto the substrate W. During scanning motion of the substrate under the projection system and the liquid supply system, hydrostatic and hydrodynamic forces may be generated which result in pressures on the liquid downwards towards the substrate.

With a localized area liquid supply system, the substrate W is moved under the projection system PL and the liquid supply system and when an edge of the substrate W is to be imaged or when a sensor on the substrate table is to be imaged or the substrate table is to be moved such that a dummy substrate or so-called closing plate can be positioned under the liquid supply system to enable substrate swap to take place, an edge of the substrate W will pass under the space 11 and liquid may leak into the gap between the substrate W and substrate table WT. This liquid may be forced in under hydrostatic or hydrodynamic pressure or the force of a gas knife or other gas flow creating device.

Although one or more embodiments of the invention will be described below in relation to providing a drain around the edge of a substrate W, the one or more embodiments are equally applicable to one or more other objects placed on the substrate table including, but no limited to, a closing plate used to maintain liquid in the liquid supply system by being attached to the bottom of the liquid supply system during, for example, substrate swap and/or one or more sensors. Thus, any reference below to the substrate W should be considered to be synonymous with any other object, such as a sensor or closing plate.

Figure 6:
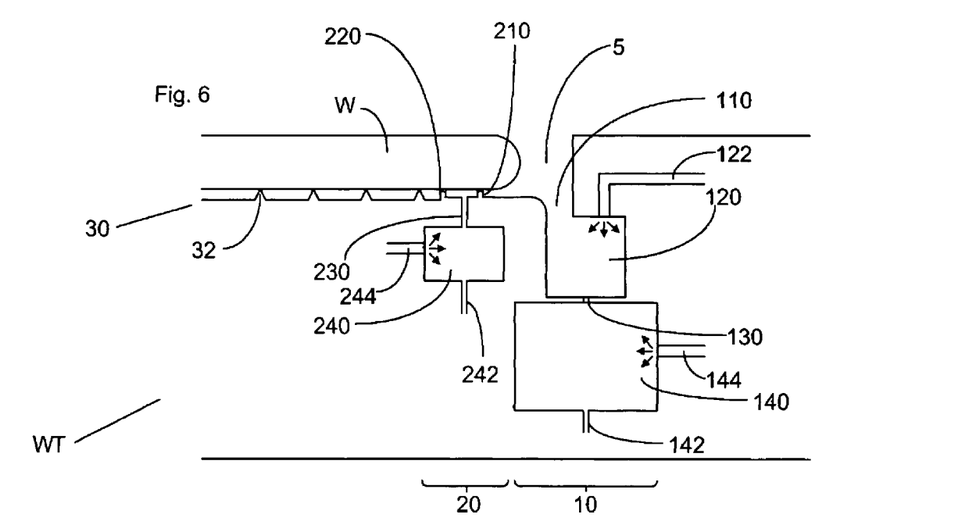
FIG. 6 illustrates, in cross-section, a substrate table according to an embodiment of the invention.

FIG. 6 illustrates an embodiment of the present invention. FIG. 6 is a cross-section through a substrate table WT and a substrate W. A gap 5 exists between an edge of the substrate W and an edge of the substrate table WT. When the edge of the substrate W is being imaged or at other times such as when the substrate W first moves under the projection system PS (as described above), the gap 5 between the edge of the substrate W and the edge of the substrate table WT will pass under, for example, the space 11 filled with liquid by the liquid supply system 12. This can result in liquid from the space 11 entering the gap.

In order to deal with the liquid entering that gap at least one drain 10, 20 is provided at the edge of the substrate W to remove any liquid which enters the gap 5. In the embodiment of FIG. 6, two drains 10, 20 are illustrated though there may only be one drain or there could be more than two drains. Each of the drains 10, 20 is, for example, annular so that the whole periphery of the substrate W is surrounded.

The primary function of the first drain 10 is to prevent bubbles of gas from entering the liquid 11 of the liquid supply system 12. Any such bubbles can deleteriously affect the imaging of the substrate W. The second drain 20 is provided to prevent any liquid which finds its way from the gap 5 to underneath the substrate W from preventing efficient release of the substrate W from the substrate table WT after imaging. As is conventional, the substrate W is held by a pimple table 30 comprising a plurality of projections 32. An underpressure applied between the substrate W and the substrate table WT by the pimple table 30 ensures that the substrate W is held firmly in place. However, if liquid gets between the substrate W and the pimple table 30, this can lead to difficulties, particularly when unloading the substrate W. The provision of the second drain 20 reduces or eliminates problems which may occur due to liquid finding its way underneath the substrate W.

Both the first and second drains 10, 20 remove liquid by way of an underpressure. That is, both drains are connected via outlets 142 and 242 to an underpressure source. This underpressure source effectively removes any liquid which enters the respective drain. However, the underpressure source is also effective to draw gas in from outside of the gap 5 above the substrate table WT (or in the case of the second drain 20, also from the pimple table 30) through the respective drains and out through the outlets. This flow of liquid and gas is not constant during use of the immersion apparatus. Measures may be taken to only connect the outlets 142, 242 to the underpressure source when there is a chance of liquid entering the gap 5, but there is the risk of an uneven heat load being applied to the substrate table WT because of the varying amounts of gas and/or liquid which pass through the drains 10, 20. These temporal uneven flows of gas and liquid result in different rates of evaporation of liquid in the drains 10, 20 thereby leading to variations in the heat losses generated by the drains 10, 20 during exposure of a batch of substrates. This variation in heat loss during exposure is due to the substrate table WT only being positioned such that an edge of the substrate W is under the space 11 during certain times which is exposure routing dependent. Thus for the first substrate of a batch of substrates, evaporation load is at different locations of the periphery of the substrate than for the following substrates. Furthermore, the timing delay of a substrate delivery from the track at the start of a new batch results in an evaporation load change due to drying up of the drains 10, 20 (and thereby less evaporation).

In order to mitigate the above mentioned changes in heat load applied by the drains 10, 20, measures are taken to provide that the heat load remains substantially constant irrespective of the position of the substrate table (i.e. that is irrespective of whether an edge of the substrate is under the space 11). The way this is accomplished can be viewed in two separate ways. First, it can be seen as ensuring that gas which would otherwise cause evaporation is saturated or at least nearly saturated with the same (type of) liquid as is used by the liquid supply device 12 so that this gas passing over liquid in the drains cannot cause evaporation. Second, it can be seen as providing a continuous flow of (immersion) liquid through the drains 10, 20 thereby evening out the heat load over time.

The construction details of each of the drains will be described in detail below. However, it should be understood that the principle of this invention can be applied to any type of drain in an immersion apparatus which by virtue of use of the apparatus is provided with a varying flow of liquid and/or gas through it and can thereby result in varying amounts of evaporation and thereby varying heat load. It will also be appreciated that the means to provide liquid to the drains 10, 20 or the means to saturate gas in the drains can be provided at any location so long as the function as described above is met and as long as there are no deleterious interactions with other components of the apparatus.

In drain 10, which is positioned radially outwardly of drain 20, a channel 110 leads from the gap 5 between the substrate W and the substrate table WT into a first chamber 120. Both the channel 110 and the chamber 120 are, for example, annular. The channel 110 is desirably in the form of a slit. That is, it is relatively narrow compared to its height. A second chamber 140 is in fluid communication with the first chamber 120 through a plurality of through holes 130. The through holes 130 are spaced around the periphery of the substrate, desirably evenly. The outlet 142, which is connected to an underpressure source, is in communication with the bottom of the second chamber 140. As will be appreciated, the shape of the chambers 120, 140 can vary in a cross-section from those illustrated in FIG. 6 and reference is made to the disclosures in Japanese patent application publication JP 2007-072118 and U.S. patent application Ser. No. 11/390,427, filed Mar.

28, 2006, for various cross-sectional shapes which work and for details regarding the surface properties of the various faces of the chambers which might be desirable.

Liquids inlets 122, 144 are provided to each of the chambers 120, 140. These liquid inlets 122, 144 can provide a spray of liquid, as illustrated, or can provide a continuous flow of liquid or anything in between (e.g. a constant drip of droplets). In that way, either gas in the respective chamber can be saturated (or nearly saturated) or a continuous flow of liquid through each chamber is provided.

It will be appreciated that only one of the chambers 120, 140 could be provided with a liquid inlet 122, 144 or that alternatively or additionally a liquid inlet could be provided in the channel 110 or even in the gap 5. If a liquid inlet is provided in the gap 5, one liquid inlet may be sufficient for both the first and second drains 10, 20. It will be appreciated that in this description when a single liquid inlet is referred to this means a single liquid inlet in cross-section. Of course the liquid inlets 122, 144 can be provided as continuous (annular) grooves or could be provided as discrete inlets around the periphery of the drain.

The second drain 20 will now be described. The outlet 242 of the second drain 20 is held at an under pressure (e.g. 0.6 bar) which is a little larger than the under pressure (e.g. 0.5 bar) of the pimple table 30. This ensures that there is a flow of gas from the pimple table 30 as well as from the gap 5 to the outlet 242.

As can be seen, two projections 210 and 220 are provided underneath the substrate W. The radially outer projection 210 is a so-called "wet seal" and is likely to have immersion liquid passing between it and the bottom surface of the substrate W. The radially inner projection 220 is a dry seal and only gas is likely to pass between it and the substrate W.

Between the two projections 210, 220 is a channel 230 which leads to a chamber 240. The chamber 240 is in fluid communication with the outlet 242 which is connected to the under pressure source. A liquid inlet 244 is provided in the chamber 240. The liquid inlet 244 acts as the mechanism to saturate gas in the chamber 240 or mechanism to provide a continuous supply of liquid to the outlet 242 irrespective of whether or not the space 11 is above the gap 5.

In an alternative arrangement, the outlet 242 is only held at an under pressure of 0.5 bar relative to the under pressure of the pimple table 30 of 0.475 bar. In that instance liquid is allowed on to the inner projection 220 and the pressure difference combined with the capillary force of the liquid is enough to keep liquid between the inner projection 220 and the substrate W but not to migrate into the pimple table 30. To maintain this pressure difference with varying resistance to gas flowing past the outer projection 210 (depending on whether liquid is present between the outer projection 210 and the substrate or not), the pressure is regulated by a restriction network outside of the substrate table. As a result, the largest part of evaporation of liquid and thereby heat load takes place in the restriction network. Thus only a small part of evaporation takes place in the substrate table WT underneath the substrate W. The wetting history dependency of that last part of the heat load can be regulated with forced wetting, desirably with an outlet between the two projections 210, 220, as described above.

As can be seen, the general principle of compensating for the wetting history dependency on the heat load of extractors in an immersion apparatus can be regulated by providing immersion liquid to those extractors on a constant basis (i.e. substrate table independent). The principle works even by providing the liquid in gaseous form (i.e. saturated or humidified gas). The principle can also be used on other extractors in an immersion machine which might suffer from the same problems. One example is extractors used in the liquid supply system which supplies liquid between the final element of the projection system and the substrate (examples of which are illustrated in FIGS. 2-5). There are some instances (e.g. during substrate swap) where the heat load generated by extractors fluctuates and the provision of liquid or humidified gas to the extractors can mitigate that difficulty.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
   a substrate table constructed to hold a substrate;
   a drain in the substrate table configured to receive a first liquid which leaks, in use, from a gap between an edge of an object on the substrate table and the substrate table;
   an outlet to the drain for the flow of the first liquid and a gas out of the drain, wherein the outlet is connected to an underpressure source to create a flow of the gas from outside the drain into the drain and out through the outlet; and
   a liquid supply device configured to actively supply a second liquid to the drain independent of the position of the substrate table, without filling the gap with the second liquid and at the same time as the first liquid and the gas flows out of the drain into the outlet.

2. The apparatus of claim 1, wherein the liquid supply device is adapted to supply second liquid at a rate and in a form substantially to saturate gas flowing through the outlet.

3. The apparatus of claim 1, comprising at least two of the drains, a first of the drains being positioned radially inwardly of a second of the drains.

4. The apparatus of claim 1, wherein the drain comprises a slit leading to a first chamber.

5. The apparatus of claim 4, wherein the liquid supply device is configured to provide the second liquid to the first chamber.

6. The apparatus of claim 4, wherein the drain further comprises a second chamber connected to the first chamber by a through hole.

7. The apparatus of claim 6, wherein the liquid supply device is configured to provide the second liquid to the second chamber.

8. The apparatus of claim 4, wherein the slit is configured to bring the first chamber into fluid communication with an edge of the substrate.

9. The apparatus of claim 1, wherein the liquid supply device is constructed and arranged to supply the second liquid in vapor form.

10. The apparatus of claim 1, wherein the object is a substrate, a sensor or a closing plate.

11. The apparatus of claim 1, wherein the first liquid and the second liquid are the same type of liquid.

12. A lithographic apparatus comprising:
   a substrate table constructed to hold a substrate;
   a liquid supply system configured to provide a first liquid on a localized area of the substrate, the substrate table and/or an object on the substrate table, between the localized area and a projection system;
   a drain in the substrate table configured to contain first liquid which leaks, in use, between an edge of the substrate and/or object and the substrate table;
   an outlet connected to an underpressure source and to the drain and arranged to remove first liquid, or a gas, or both first liquid and gas, from the drain; and
   a saturator having an inlet, below an inlet of the drain, configured to supply a second liquid in liquid or vapor form to saturate, within the drain, any gas which enters and/or leaves the drain with the second liquid.

13. The apparatus of claim 12, wherein the second liquid is the same as the first liquid supplied by the liquid supply system.

14. The apparatus of claim 12, wherein the saturator is configured to operate independently of the position of the substrate table.

15. The apparatus of claim 12, wherein the object is a sensor or a closing plate.

16. A device manufacturing method comprising projecting a patterned beam of radiation through a first liquid onto a substrate and collecting first liquid which leaks between an edge of an object and a substrate table configured to hold the substrate in a drain, removing first liquid from the drain and saturating, within the drain, gas flowing in and/or out of the drain using an inlet, below an inlet of the drain, supplying a second liquid in liquid or vapor form.

17. The method of claim 16, wherein the object is a substrate, a sensor or a closing plate.

18. The method of claim 17, comprising supplying the second liquid to the gas that will flow in and/or out of the drain in vapor form.

19. The method of claim 16, wherein the second liquid is the same as the first liquid.

20. The method of claim 16, comprising saturating independently of the position of the substrate table.

* * * * *